United States Patent
Graybill et al.

(10) Patent No.: US 8,054,638 B2
(45) Date of Patent: Nov. 8, 2011

(54) LATCHING APPARATUS FOR FACILITATING DOCKING OF AN ELECTRONIC COMPONENT

(75) Inventors: David P. Graybill, Staatsburg, NY (US); Robert K. Mullady, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 12/417,926

(22) Filed: Apr. 3, 2009

(65) Prior Publication Data

US 2010/0254106 A1    Oct. 7, 2010

(51) Int. Cl.
 *H05K 7/12* (2006.01)
(52) U.S. Cl. ........ 361/747; 361/726; 361/732; 361/740; 361/759; 361/801; 312/223.2
(58) Field of Classification Search .................. 361/726, 361/732, 740, 747, 759, 801; 312/223.2, 312/223.3
See application file for complete search history.

(56) References Cited

U.S. PATENT DOCUMENTS

| | | | |
|---|---|---|---|
| 5,283,714 A | 2/1994 | Tsai et al. | |
| 5,622,510 A | 4/1997 | Ishida | |
| 5,793,607 A | 8/1998 | Karidis et al. | |
| 6,015,308 A | 1/2000 | Lee et al. | |
| 6,095,835 A | 8/2000 | Oguchi | |
| 6,319,029 B2 | 11/2001 | Nishioka | |
| 6,587,350 B1 | 7/2003 | Lin et al. | |
| 6,956,745 B2 * | 10/2005 | Kerrigan et al. | 361/726 |
| 6,975,519 B2 | 12/2005 | Siahpolo et al. | |
| 7,027,309 B2 | 4/2006 | Franz et al. | |
| 7,499,271 B2 * | 3/2009 | Wagatsuma et al. | 361/679.33 |
| 7,570,484 B1 * | 8/2009 | Sivertsen | 361/679.37 |
| 2004/0264146 A1 * | 12/2004 | Kerrigan et al. | 361/726 |

\* cited by examiner

*Primary Examiner* — Dameon Levi
(74) *Attorney, Agent, or Firm* — Dennis Jung, Esq.; Kevin P. Radigan, Esq.; Heslin Rothenberg Farley & Mesiti P.C.

(57) ABSTRACT

A latching apparatus is coupled to a first electronic component for facilitating docking to a second electronic component. The apparatus includes a pivotable actuation handle, and slide and pivotable linkages. The slide linkage couples to the pivotable actuation handle and is slidable in directions which the first component docks to the second component. The pivotable linkage is also coupled to the slide linkage and includes a latching hook at its distal end. With the first component disposed for docking relative to the second component, pivotal actuation of the handle to open is translated to pivotal movement of the pivotable linkage to facilitate aligning the latching hook over a hook pocket of the second component, and pivotal actuation of the handle closed is translated to pivotal movement of the pivotable linkage to engage the hook pocket, and thereby draw the first component into docked relation with the second component.

18 Claims, 9 Drawing Sheets

FIG. 8

LATCHING APPARATUS FOR FACILITATING DOCKING OF AN ELECTRONIC COMPONENT

TECHNICAL FIELD

The present invention relates in general to latching apparatuses, and more particularly, to latching apparatuses for facilitating docking of a first electronic component to a second electronic component or structure.

BACKGROUND OF THE INVENTION

In many electronic systems (such as server applications), processors, along with their associated electronics (e.g., memory, disk drives, power supplies, etc.), are packaged in removable node configurations (e.g., drawers or blades) disposed within a housing. Each node requires multiple electrical connections which are generally provided by two-part, multi-contact electrical connectors which include a node part of the connector attached to the node component and a housing part attached to a rack, system chassis assembly, or other backplane component of the housing, which acts as a socket for receiving the node part of the connector. As used herein, "node" generally means any assembly or structure that contains electronic components (including, but not limited to, semiconductor devices, resistors, capacitors, relays, switches, and connectors) or electrical connections for an electronic system. As used herein, "housing" generally means any assembly or structure adapted to receive one or more electronic nodes, including, but not limited to, a rack, a chassis assembly, backplane circuit board, etc. At each level of assembly, successful alignment and mating of connector parts is required in order to provide reliable electrical connection between the parts of the connectors, and therefore, between the components of the electronic system.

Insertion and extraction of components in an electronic (or computer) system is becoming more challenging as the density of computer system assemblies increase. With less room being allocated for mechanical functions, the interconnect technologies are becoming more and more critical, requiring more precise control of the insertion and extraction of a component from the system assembly. This is typically controlled by the geometry of the contact systems becoming smaller and the effective "wipe" of the connectors being reduced.

Accordingly, there is a continuing need for improved latching apparatuses for facilitating insertion and extraction of one electronic component relative to another electronic component which require less space than prior latching solutions.

SUMMARY OF THE INVENTION

The shortcomings of the prior art are overcome and additional advantages are provided through the provision of a latching apparatus coupled to a first component for facilitating docking of the first component to a second component. The latching apparatus includes a pivotable actuation handle, a slide linkage, and a pivotable linkage. The slide linkage is coupled adjacent to a first end to the pivotable actuation handle, and the pivotable linkage is coupled to the slide linkage adjacent to a second end thereof, wherein the slide linkage is slidable in directions in which the first component is docked to and undocked from the second component. With the first component disposed for docking relative to the second component, pivotal actuation of the pivotable actuation handle to open is translated to linear extension of the slide linkage, which is translated to pivotal movement of the pivotable linkage for facilitating aligning a latching hook at a distal end thereof over a hook pocket of the second component, and pivotal actuation of the pivotable actuation handle closed is translated to linear retraction of the slide linkage, which is translated to pivotal movement of the pivotable linkage to engage the latching hook at the distal end thereof with the hook pocket, thereby drawing the first component into docked relation with the second component.

In another aspect, an electronic system is provided which comprises a housing and an electronic node which includes an electronic sub-component. The electronic node is configured to dock to the housing of the electronic system, and the electronic sub-component is configured to dock to the electronic node via multiple lateral latching apparatuses coupled to the electronic sub-component. Each latching apparatus includes a pivotable actuation handle, a slide linkage, and a pivotable linkage. The slide linkage is coupled at a first end to the pivotable actuation handle, and the pivotable linkage is coupled to a second end of the slide linkage, wherein the slide linkage is slidable in directions in which the electronic sub-component is docked to and undocked from the electronic node. With the electronic sub-component disposed for docking relative to the electronic node, pivotal actuation of the pivotable actuation handle to open is translated to linear extension of the slide linkage, which is translated to pivotal movement of the pivotable linkage for facilitating aligning of a latching hook at a distal end thereof over a hook pocket of the electronic node, and pivotal actuation of the pivotable actuation handle closed is translated to linear retraction of the slide linkage, which is translated to pivotal movement of the pivotable linkage to engage the latching hook at the distal end thereof with the hook pocket, and thereby draw the electronic sub-component into docked relation with the electronic node.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
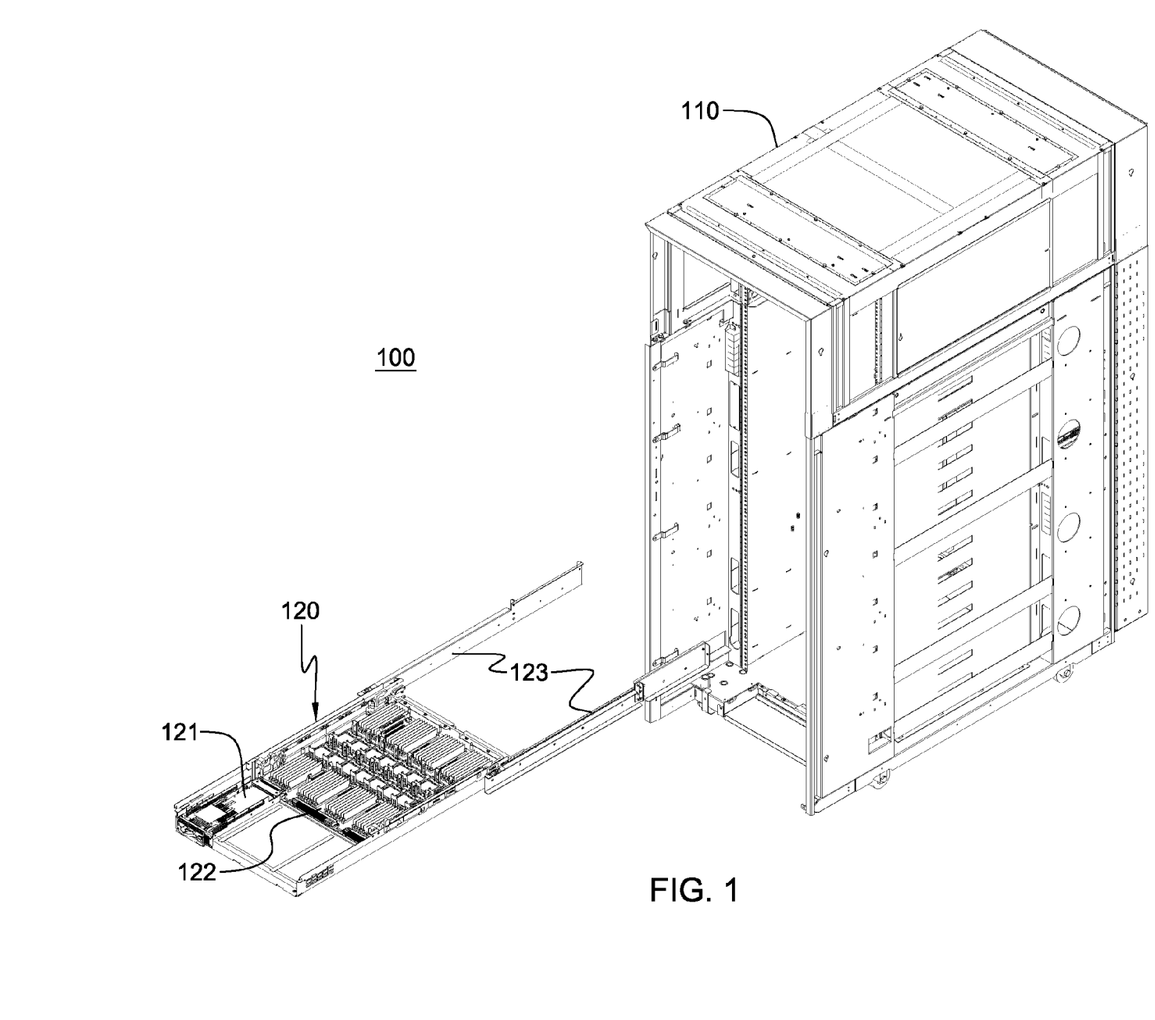
FIG. 1 depicts one embodiment of an electronic system comprising an electronic node and a housing, wherein an electronic sub-component is docked to the electronic node via multiple lateral latching apparatuses, in accordance with an aspect of the present invention.

FIG. 1 depicts one embodiment of an electronic system, generally denoted 100, in accordance with an aspect of the present invention. Electronic system 100 includes a housing 110 configured (in this example) for receiving multiple electronic nodes 120 of the electronic system. Electronic node 120 is in one example a blade of a multi-blade server system. Commercial embodiment of such a multi-blade server system are (by way of example) the High Performance Computing (HPC) clustered solutions offered by International Business Machines Corporation, of Armonk, N.Y. By way of specific example, the multi-blade server system may comprise a stand-alone server system which incorporates scalable computing functionality up to, for example, fourteen high-performance servers (or nodes).

As shown in FIG. 1, electronic node 120 comprises in this example a node component 122 to which one or more electronic sub-components 121 dock. In the embodiment illustrated, electronic node 120 slidably inserts via rails 123 into housing 110. In addition to accommodating multiple electronic nodes, housing 110 also accommodates supporting power supplies, networking equipment, etc, as needed for the electronic system.

Figure 2:
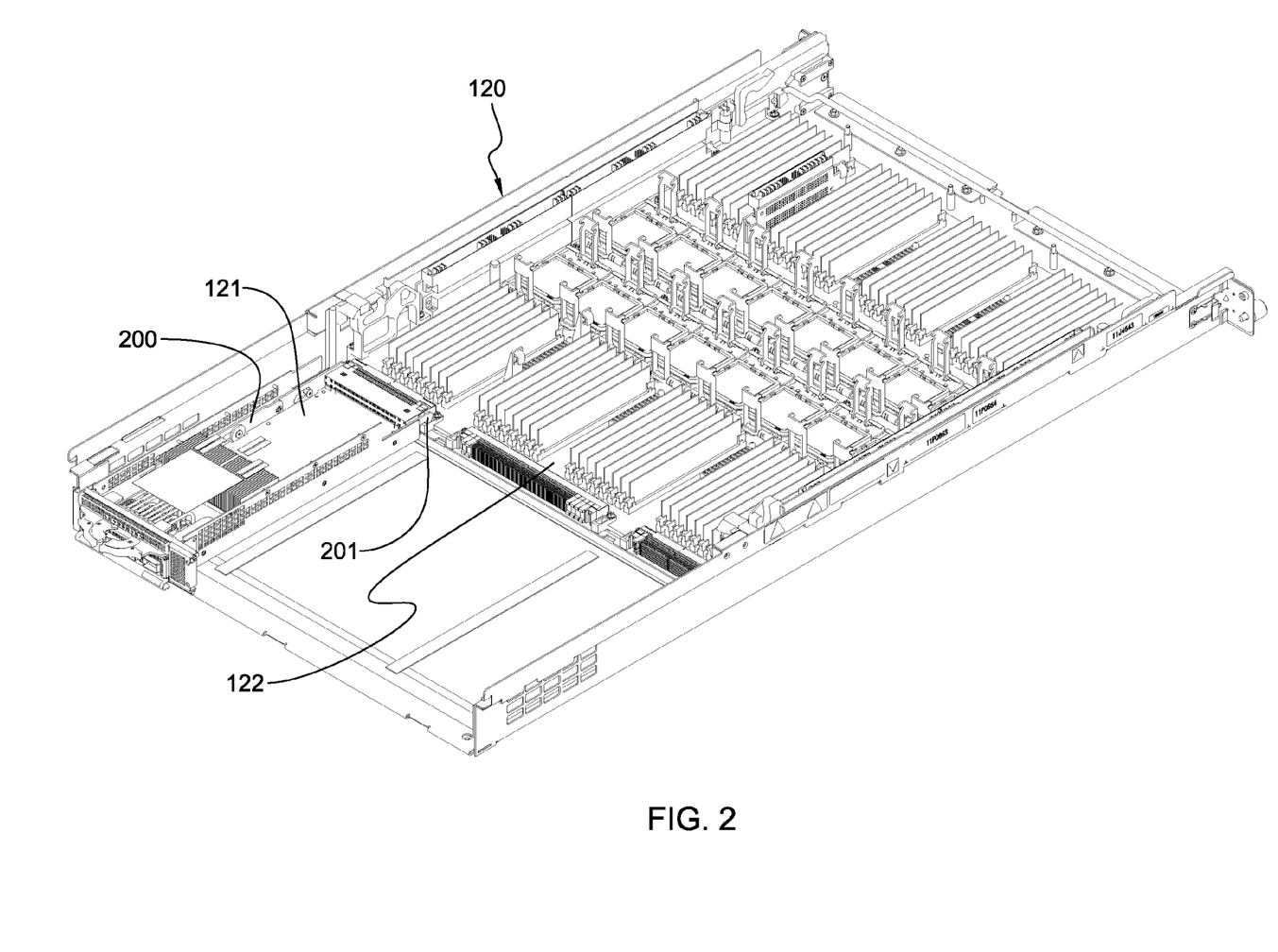
FIG. 2 depicts in greater detail one embodiment of the electronic node of FIG. 1, showing the electronic sub-component thereof latched in docked position to the electronic node via two lateral latching apparatuses, in accordance with an aspect of the present invention.

FIG. 2 depicts in greater detail one embodiment of electronic node 120. In this embodiment, electronic sub-component 121 is shown docked to node component 122 of electronic node 120 via a first lateral latching apparatus 200 and a second lateral latching apparatus 201, in accordance with an aspect of the present invention. Although not shown, additional electronic sub-components may be similarly docked to the node component across the front of the node component.

The lateral latching apparatuses each comprise a low-profile actuation linkage that provides linear and pivotal translation of a latch to facilitate insertion and extraction of the electronic sub-component into docked and undocked relation with the node component of electronic node 120. Note that although described herein as facilitating docking of an electronic sub-component to an electronic node, the lateral latching apparatuses presented are generally applicable to facilitating docking and undocking of any electronic component relative to another electronic component. For example, in one embodiment, electronic node 120 could itself comprise lateral latching apparatuses such as described herein to facilitate docking of the electronic node with the housing, in which case the housing's backplane would comprise appropriate hook pockets for engagement by the latching hooks at the distal ends of the pivotable linkages of the latching apparatuses (which are described further below).

Figure 3A:
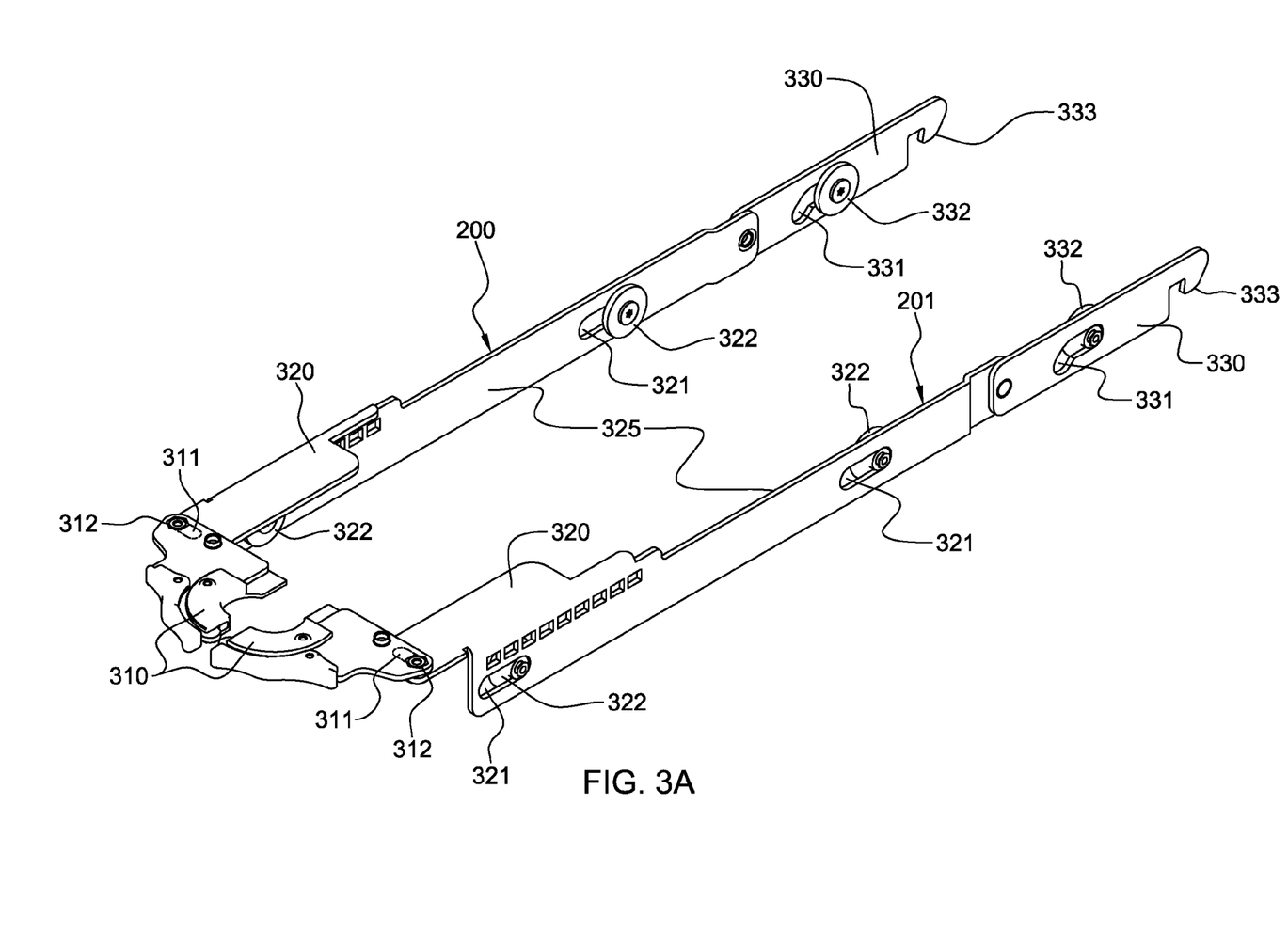
FIGS. 3A & 3B are top and bottom isometric views, respectively, of two lateral latching apparatuses configured for disposition along opposing side walls of an electronic sub-component to facilitate docking of the electronic sub-component to another component (such as the electronic node depicted in FIGS. 1 & 2) of a system assembly, in accordance with an aspect of the present invention.
Figure 3B:
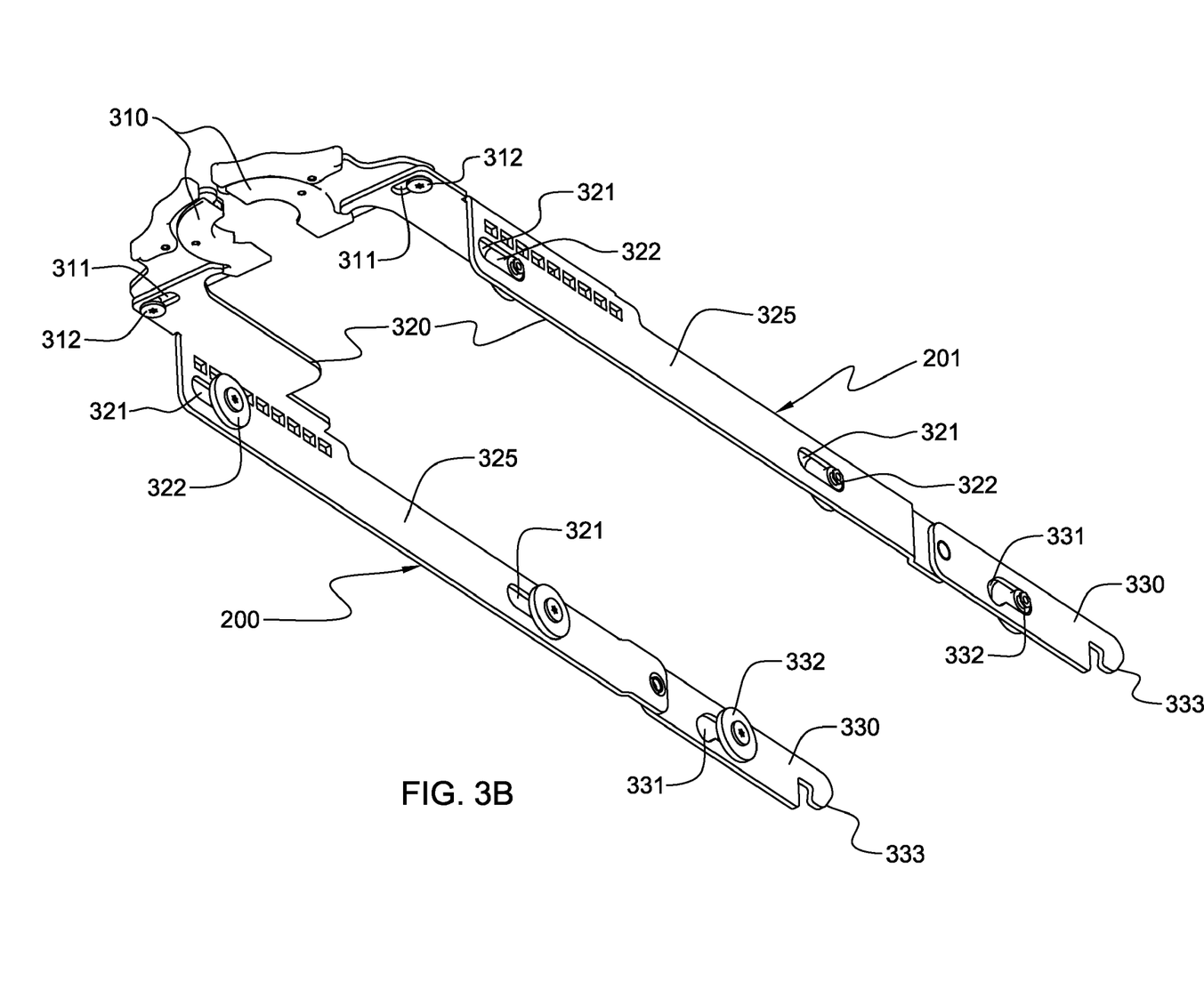

FIGS. 3A & 3B depict perspective views of two lateral latching apparatuses 200, 201 to be employed as the latching mechanism for facilitating docking and undocking of a first component relative to a second component, in accordance with an aspect of the present invention. Each latching apparatus 200, 201 comprises a pivotable actuation handle 310, a slide linkage 320 and a pivotable linkage 330. As shown, slide linkage 320 couples at a first end to a respective pivotable actuation handle 310 via, for example, a transverse slot 311 therein and a bushing 312 which reciprocates within the transverse slot with pivotal movement of pivotable actuation handle 310 for converting pivotal actuation of the actuation handle to linear translation of the slide linkage. Each pivotable linkage 330 couples to a second end of a respective slide linkage 320.

More particularly, linear extension of slide linkages 320 is effectuated by pivoting open the respective pivotable actuation handle 310, which as explained further below is ultimately translated to pivotal movement of the respective pivotable linkage 330 to raise a latching hook 333 at a distal end thereof. Linear extension of slide linkage 320 is facilitated by multiple elongate slots 321 in an elongate portion 325 thereof and a respective captivation cam mechanism 322 extending through each elongate slot to facilitate constrained reciprocation of the slide linkage linearly between an extended position and a retracted position, responsive to pivoting open or closed the pivotable actuation handle, respectively.

As described further below, each captivation cam mechanism couples the respective latching apparatus to the first component, for example, the electronic sub-component 121 described above in connection with FIGS. 1 & 2. Similarly, each pivotable linkage 330 includes a curved slot 331, which in one embodiment, may be an approximately L-shaped, curved slot configured based on the extent to which pivotable linkage 330 is to be raised with linear extension of slide linkage 320. Again, a captivation cam mechanism 332 extends through curved slot 331 of pivotable linkage 330 and, in one embodiment, couples the pivotable linkage to a side of the first component, as described further below.

As illustrated in FIGS. 3A & 3B, pivotable linkage 330 is, in one embodiment, an elongate element, and the captivation cam mechanism 332 reciprocates within curved slot 331 of pivotable linkage 330 with reciprocal movement of slide linkage 320. Extension of slide linkage 320 in a direction towards a second component (not shown) to which the first component (not shown) is to be docked results in raising of the latching hook 333 at the distal end relative to the first component, and retraction of slide linkage 320 in a direction away from the second component to which the first component is to dock or undock results in lowering of the latching hook relative to the first component, wherein the pivotal raising and lowering is constrained by movement of the captivation cam mechanism 332 within curved slot 331 of pivotable linkage 330.

Figure 4:
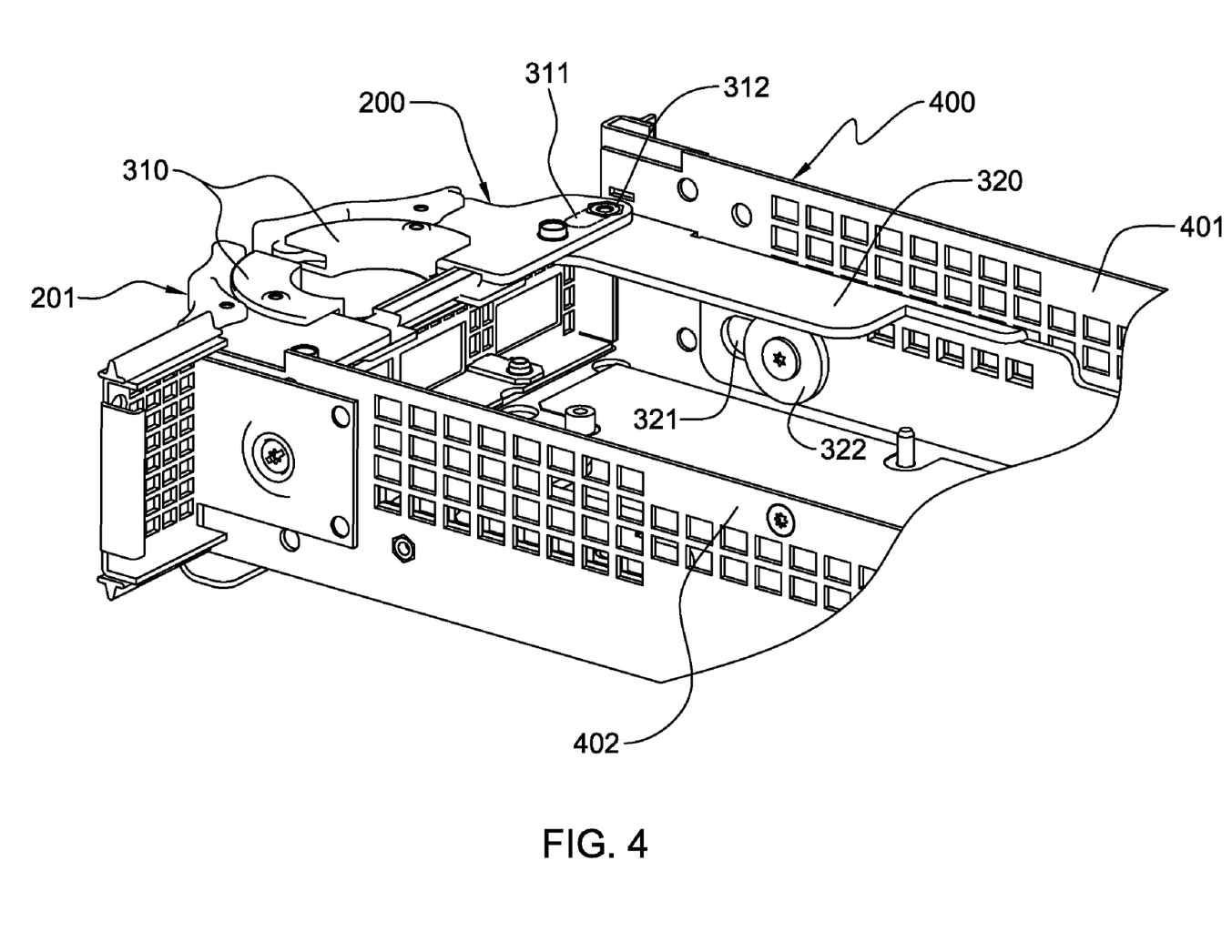
FIG. 4 is a partial isometric view of an electronic sub-component and first and second lateral latching apparatuses, with the pivotable actuation handles thereof shown closed, and the slide linkages retracted, in accordance with an aspect of the present invention.

FIG. 4 is a partial perspective view of an electronic sub-component 400 having opposing first and second sides 401, 402. Additionally, first lateral latching apparatus 200 is shown coupled to first side 401 of electronic sub-component 400, and second lateral latching apparatus 201 is shown coupled to second side 402 of electronic sub-component 400. This figure illustrates pivotable actuation handles 310 in closed position, with the slide linkages 320 of first and second lateral latching apparatuses 200, 201 in retracted position, and the depicted captivation cam mechanism 322 shown at one end of the illustrated elongate slot 321 in slide linkage 320, as well as bushing 312 disposed at one end of the illustrated transverse slot 311 (shown in phantom). As explained above, captivation cam mechanism 322 couples the latching apparatus to a respective side of the electronic sub-component, and facilitates constrained reciprocation of the slide linkages (for example) between an extended position and the illustrated retracted position responsive to opening or closing of the pivotable actuation handle, respectively.

Figure 5:
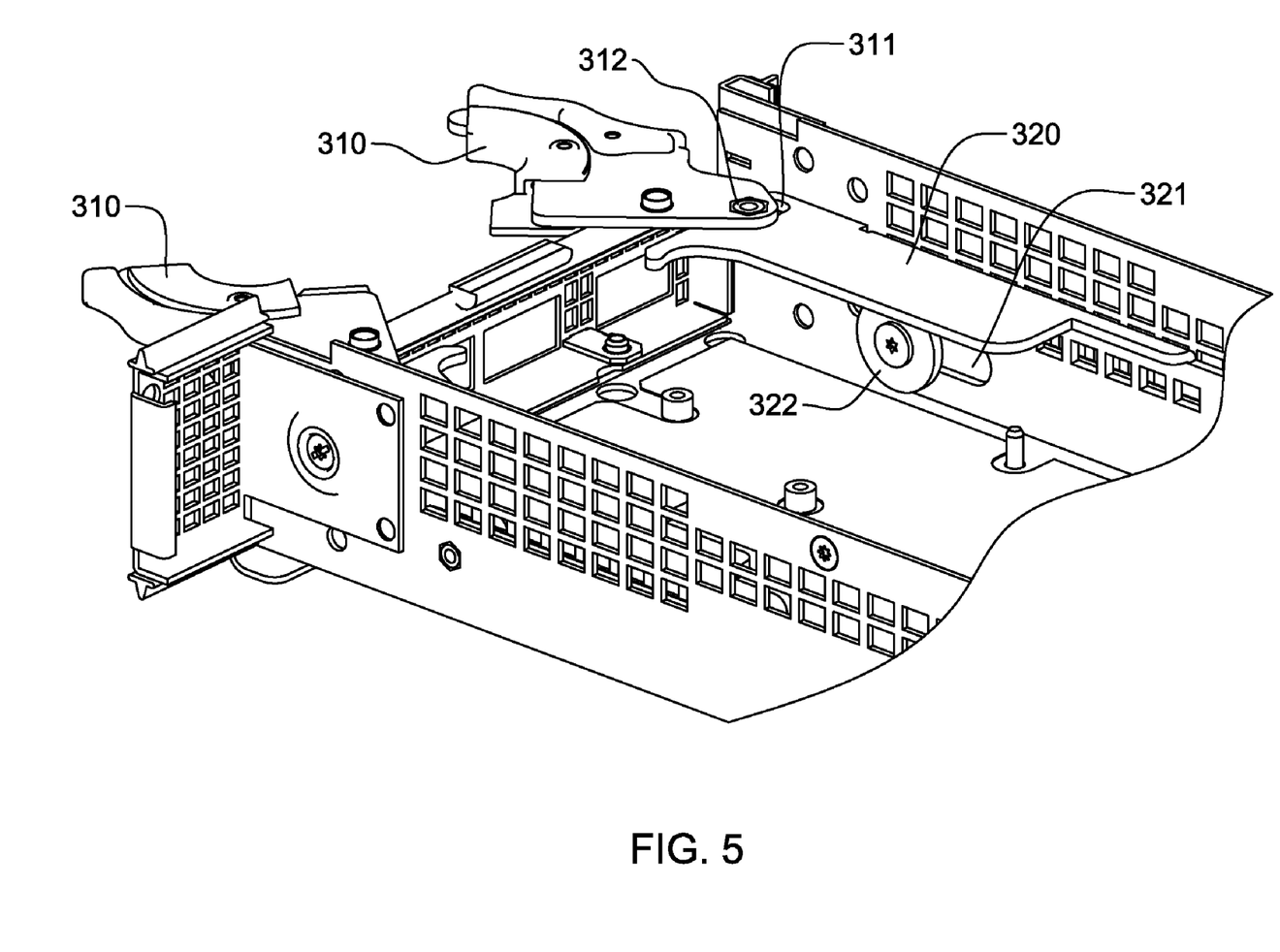
FIG. 5 depicts the partial isometric view of FIG. 4, with the pivotable actuation handles shown actuated open, and the slide linkages extended, in accordance with an aspect of the present invention.

FIG. 5 illustrates the partial perspective view of FIG. 4, with the pivotable actuation handles 310 shown open. As illustrated, opening of pivotable actuation handles 310 results in bushings 312 being forced to the opposite end of transverse slots 311 in slide linkages 320, which results in linear extension of slide linkages 320, and movement of captivation cams 322 to an opposite end of elongate slots 321, which cooperate to constrain linear movement of the slide linkages.

Figure 6:
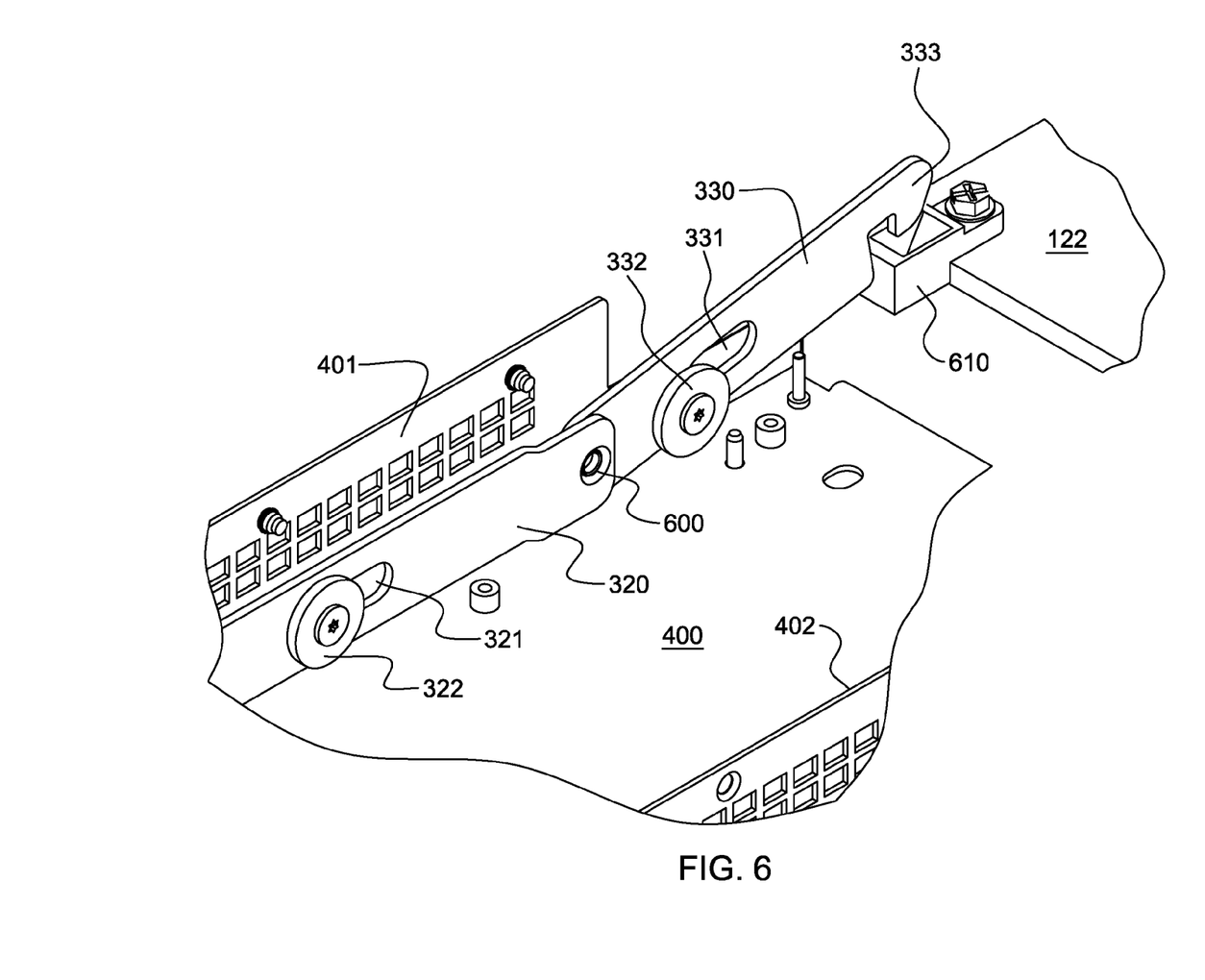
FIG. 6 is a partial isometric view of the electronic sub-component of FIGS. 4 & 5, showing the slide linkage of the first lateral latching apparatus in an extended position and the pivotable linkage thereof pivoted upwards for facilitating alignment of the latching hook at its distal end over a hook pocket of the electronic node to which the electronic sub-component is to dock, in accordance with an aspect of the present invention.

FIG. 6 is a partial perspective view of the electronic sub-component described above, showing slide linkage 320 coupled to first side 401 of opposing side walls 401 and 402, in an extended position with the illustrated pivotable linkage 330 raised above a base 400 of the electronic sub-component. This is facilitated via a pivotal connection 600 of pivotable linkage 330 to slide linkage 320, and by configuring curved slot 331 in pivotable linkage 330 to ensure that as captivation cam mechanism 322 reciprocates therein, that the distal end of pivotable linkage 330 rises or lowers with extension or retraction of slide linkage 320. In the illustrated embodiment, node component 122 to which the electronic sub-component is to dock includes a hook pocket 610 configured and positioned to receive the latching hook 333 at the distal end of pivotable linkage 330. This is illustrated in greater detail in FIGS. 7 & 8.

Figure 7:
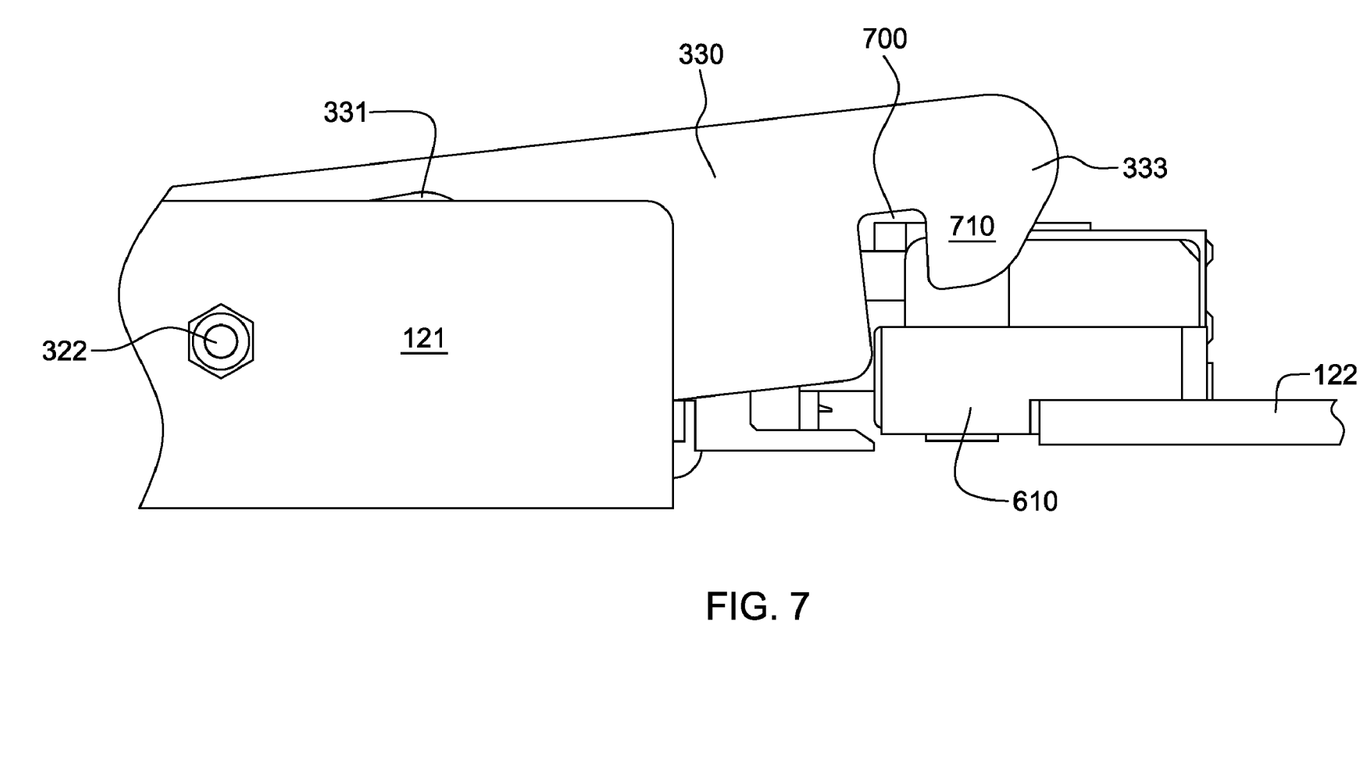
FIG. 7 is a partial elevational view of the structure of FIGS. 4-6, illustrating alignment of the latching hook at the distal end of the pivotable linkage of the second lateral latching apparatus over a respective hook pocket of the electronic node to which the electronic sub-component is being docked, in accordance with an aspect of the present invention.
Figure 8:
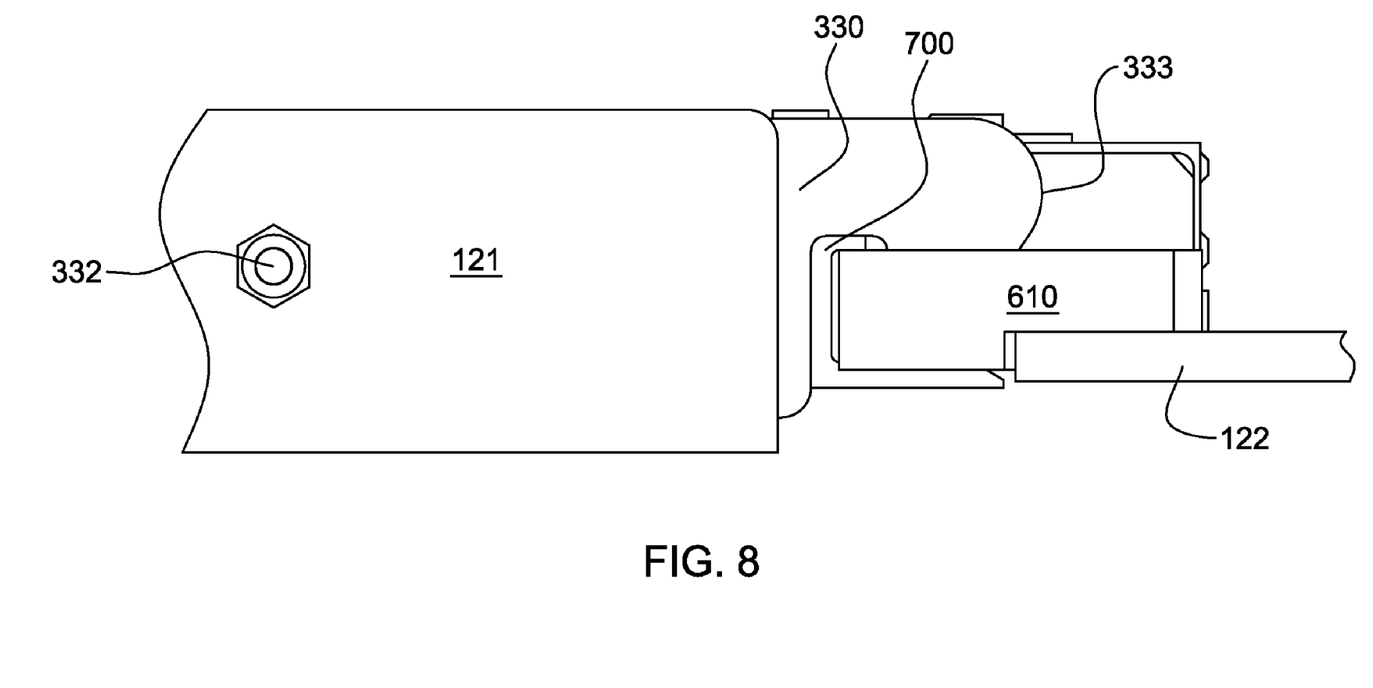
FIG. 8 is an elevational depiction of the structure of FIG. 7 after actuation of the pivotable actuation handles (illustrated in FIGS. 4 & 5) closed, and depicting engagement of the latching hook in the hook pocket and drawing of the electronic sub-component into docked relation with the electronic node, in accordance with an aspect of the present invention.

As shown in the side elevational view of FIG. 7, with pivotable linkage 330 raised due to extension of the respective slide linkage and movement of captivation cam mechanism 322 within curved slot 331, latching hook 333 at the distal end of pivotable linkage 330 can be positioned over hook pocket 610 coupled to node component 122. Latching hook 333 is provided with a channel 700 sized such that a latching member 710 of the latching hook resides within hook pocket 610 with lowering of latching hook 333. This is illustrated in FIG. 8, wherein latching hook 333 is lowered by pivotal actuation of the respective pivotable actuation handle closed, which was translated to linear retraction of the respective slide linkage, which in turn was translated to pivotal lowering of the pivotable linkage such that the latching hook at the distal end thereof engages the hook pocket 610 coupled to node component 122. FIG. 8 thus illustrates a portion of the electronic sub-component 121 in docked position relative to the node component 122 of the electronic node.

To summarize, the latching apparatus described herein comprises a low-profile actuation linkage that provides linear translation to insert and/or extract a first component from docked relation with a second component. The latching apparatus described provides rotational translation that facilitates engagement and/or disengagement of the first component and the second component at the attach point. Advantageously, the low-profile linkage described herein provides less-tolerance build-up between components by actuating off of the second component itself, rather than a cage structure surrounding the second component. More particularly, by referencing off the hook pocket mounted directly to the second component (e.g., printed circuit card) to which the node connector part is mounted, tolerances associated with other housings or other mechanical structures surrounding the second component are eliminated.

Two lateral latching apparatuses are utilized (in the embodiment described herein) and mounted on either side of a first component in order to provide equalized force as the docking insertion/extraction of the first component relative to the second component occurs. There are three main components to each latching apparatus, that is, the pivotable actuation handle, the slide linkage, and the pivotable linkage. The pivotable actuation handle provides a means to translate the slide linkage and is the interface to the manufacturer/service personnel. This provides a means to actuate the linkage and lock the linkage in a closed position. The slide linkage connects to the pivotable actuation handle via an interlocking profile or pin which turns the rotation of the actuation handle into linear actuation of the slide linkage. In one embodiment, multiple captivation cam mechanism (or bushings) are used to stabilize the linkage and allow for smooth movement. Each pivotable linkage allows the latching hook (or pawl) at the distal end thereof to engage and disengage the hook pocket of the second component to facilitate docking or undocking of the components.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A latching apparatus coupled to a first component for facilitating docking of the first component to a second component, the latching apparatus comprising:
    a pivotable actuation handle;
    a slide linkage coupled adjacent a first end to the pivotable actuation handle, the slide linkage being slidable in directions which the first component is docked to and undocked from the second component;
    a pivotable linkage coupled to a second end of the slide linkage; and
    wherein with the first component disposed for docking relative to the second component, pivotal actuation of the pivotable actuation handle to open is translated to linear extension of the slide linkage, which is translated to pivotal movement of the pivotable linkage for facilitating aligning a latching hook at a distal end thereof over a hook pocket of the second component, and pivotal actuation of the pivotable actuation handle closed is translated to linear retraction of the slide linkage, which is translated to pivotal movement of the pivotable linkage to engage the latching hook at the distal end of the pivotable linkage with the hook pocket, and thereby to draw the first component into docked relation with the second component.

2. The latching apparatus of claim 1, wherein the slide linkage comprises an elongate portion with an elongate slot therein, and wherein the latching apparatus further comprises a captivation cam mechanism extending through the elongate slot, the captivation cam mechanism facilitating constrained reciprocation of the slide linkage linearly between an extended position and a retracted position responsive to opening and closing of the pivotable actuation handle, respectively.

3. The latching apparatus of claim 2, wherein the captivation cam mechanism couples the latching apparatus to the first component.

4. The latching apparatus of claim 1, wherein the slide linkage comprises an elongate portion with multiple elongate slots therein, and the latching apparatus further comprises multiple captivation cam mechanisms, each captivation cam mechanism being coupled to the first component and extending through a respective elongate slot of the multiple elongate slots to facilitate constrained reciprocation of the slide linkage linearly between an extended position and a retracted position responsive to opening and closing of the pivotable actuation handle, respectively.

5. The latching apparatus of claim 1, wherein the slide linkage further comprises a transverse slot disposed adjacent to the first end thereof and the latching mechanism further comprises a bushing coupled to the pivotable actuation handle and extending into the transverse slot of the slide linkage for facilitating conversion of pivotal actuation of the pivotable actuation handle to linear translation of the slide linkage.

6. The latching apparatus of claim 1, wherein the pivotable linkage couples to the second end of the slide linkage via a pivotal connection.

7. The latching apparatus of claim 1, wherein the pivotable linkage comprises an elongate element with a curved slot therein, and wherein the latching apparatus further comprises a captivation cam mechanism coupled to the first component and extending through the curved slot of the elongate element, wherein the captivation cam mechanism reciprocates within the curved slot of the pivotable linkage with reciprocal movement of the slide linkage, and wherein extension of the slide linkage in a direction towards the second component responsive to pivotal actuation of the pivotable actuation handle open results in raising of the distal end of the pivotable linkage relative to the first component, and retraction of the slide linkage in a direction away from the second component responsive to pivotal actuation of the pivotable actuation handle closed results in lowering of the distal end thereof relative to the first component, the pivotal raising and lowering being constrained by movement of the captivation cam mechanism within the curved slot in the pivotable linkage.

8. The latching apparatus of claim 1, wherein the latching apparatus is a low-profile, lateral latching apparatus coupled to the first component along a first side or a second side thereof.

9. The latching apparatus of claim 1, wherein the first component is an electronic sub-component of an electronic node of a multi-node electronic system, and wherein the second component is the electronic node of the multi-node electronic system.

10. An electronic system comprising:
a housing;
an electronic node comprising an electronic sub-component, the electronic node being configured to dock to the housing of the electronic system; and
wherein the electronic sub-component of the electronic node is configured to dock to the electronic node via multiple, lateral latching apparatuses coupled to the electronic sub-component, each lateral latching apparatus comprising:
a pivotable actuation handle;
a slide linkage coupled at a first end to the pivotable actuation handle, the slide linkage being slidable in directions which the electronic sub-component is docked to and undocked from the electronic node;
a pivotable linkage coupled to a second end of the slide linkage; and
wherein with the electronic sub-component disposed for docking relative to the electronic node, pivotal actuation of the pivotable actuation handle to open is translated to linear extension of the slide linkage, which is translated to pivotal movement of the pivotable linkage for facilitating aligning a latching hook at a distal end thereof over a hook pocket of the electronic node, and pivotal actuation of the pivotable actuation handle closed is translated to linear retraction of the slide linkage, which is translated to pivotal movement of the pivotable linkage to engage the latching hook at the distal end of the pivotable linkage with the hook pocket, and thereby to draw the electronic sub-component into docked relation with the electronic node.

11. The electronic system of claim 10, wherein the electronic node is an electronic drawer comprising a server of the electronic system, and wherein the housing is configured to accommodate multiple electronic drawers in docked relation thereto.

12. The electronic system of claim 10, wherein the slide linkage of each lateral latching apparatus comprises an elongate portion with an elongate slot therein, and each lateral latching apparatus further comprises a captivation cam mechanism extending through the elongate slot, the captivation cam mechanism facilitating constrained reciprocation of the slide linkage linearly between an extended position and a retracted position responsive to opening and closing of the pivotable actuation handle, respectively.

13. The electronic system of claim 12, wherein the captivation cam mechanism of each lateral latching apparatus couples the lateral latching apparatus to the electronic sub-component.

14. The electronic system of claim 10, wherein the slide linkage of each lateral latching apparatus comprises an elongate portion with multiple elongate slots therein, and each lateral latching apparatus further comprises multiple captivation cam mechanisms, each captivation cam mechanism being coupled to the electronic sub-component and extending through a respective elongate slot of the multiple elongate slots to facilitate constrained reciprocation of the slide linkage linearly between an extended position and a retracted position responsive to pivotal actuation of the pivotable actuation handle open and closed, respectively.

15. The electronic system of claim 10, wherein the slide linkage of each lateral latching apparatus further comprises a transverse slot disposed at the first end thereof and each lateral latching mechanism further comprises a bushing coupled to the pivotable actuation handle and extending into the transverse slot of the slide linkage to facilitate conversion of pivotal actuation of the pivotable actuation handle to linear translation of the slide linkage.

16. The electronic system of claim 10, wherein the pivotable linkage of each lateral latch apparatus couples to the second end of the slide linkage thereof via a pivotal connection, and the pivotable linkage comprises an elongate element with a curved slot therein, and wherein each lateral latching apparatus further comprises a captivation cam mechanism coupled to the electronic sub-component and extending through the curved slot of the elongate element, wherein the captivation cam mechanism reciprocates within the curved slot of the pivotable linkage with reciprocal movement of the slide linkage, and wherein extension of the slide linkage in a direction towards the electronic node responsive to pivotal actuation of the pivotable actuation handle open results in raising the distal end of the pivotable linkage relative to the electronic sub-component, and retraction of the slide linkage in a direction away from the electronic node responsive to pivotal actuation of the pivotable actuation handle closed results in lowering of the distal end thereof relative to the electronic sub-component, the pivotal raising and lowering being constrained by movement of the captivation cam mechanism within the curved slot in the pivotable linkage.

17. The electronic system of claim 10, wherein the slide linkages and pivotable linkages of the multiple lateral latching apparatuses are, at least in part, low-profile linkages, and wherein the multiple lateral latching apparatuses actuate relative to the electronic sub-component.

18. The electronic system of claim 10, wherein the multiple lateral latching apparatuses facilitate applying laterally equalized forces for docking or undocking the electronic sub-component relative to the electronic node.

* * * * *